(12) United States Patent
Winkler (10) Patent No.: US 12,368,454 B2
(45) Date of Patent: Jul. 22, 2025

(54) COMPRESSION DEVICE, DECOMPRESSION DEVICE, AND METHOD FOR COMPRESSING AND/OR DECOMPRESSING SIGNALS

(71) Applicant: Rohde & Schwarz GmbH & Co. KG, Munich (DE)

(72) Inventor: Thomas Winkler, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 426 days.

(21) Appl. No.: 18/056,983

(22) Filed: Nov. 18, 2022

(65) Prior Publication Data
US 2024/0171196 A1 May 23, 2024

(51) Int. Cl.
*H03M 7/40* (2006.01)
*H03M 7/30* (2006.01)
*H04L 27/26* (2006.01)

(52) U.S. Cl.
CPC ........... *H03M 7/40* (2013.01); *H03M 7/6011* (2013.01); *H04L 27/2602* (2013.01)

(58) Field of Classification Search
CPC .... H03M 7/40; H03M 7/6011; H04L 27/2602
See application file for complete search history.

(56) References Cited

U.S. PATENT DOCUMENTS

| | | | |
|---|---|---|---|
| 7,394,410 B1* | 7/2008 | Wegener | H03M 7/30 341/61 |
| 2008/0123731 A1* | 5/2008 | Wegener | G06F 17/141 375/240 |
| 2013/0073263 A1 | 3/2013 | Sieracki | |
| 2015/0201213 A1* | 7/2015 | Suzuki | H04N 19/117 375/240.12 |

* cited by examiner

*Primary Examiner* — Duc C Ho
(74) *Attorney, Agent, or Firm* — Studebaker Brackett PLLC (57) ABSTRACT

A compression device for compressing a signal is provided. Said compression device comprises an input for inputting the signal, a processor for performing source separation and/or time frame separation to find recognizable signal components with respect to the signal and/or for determining major characteristics of the signal and/or components of the signal as at least one signal parameter set, a signal generator for generating a known signal on the basis of the at least one signal parameter set, a subtractor for subtracting the known signal from the signal to form a remainder signal, and an output for outputting a compressed signal comprising the remainder signal and the at least one signal parameter set.

20 Claims, 5 Drawing Sheets

COMPRESSION DEVICE, DECOMPRESSION DEVICE, AND METHOD FOR COMPRESSING AND/OR DECOMPRESSING SIGNALS

TECHNICAL FIELD

The invention relates to a compression device for compressing a signal, a decompression device for decompressing a compressed signal comprising a remainder signal and at least one signal parameter set, and a method for compressing a signal and/or for decompressing a compressed signal comprising a remainder signal and at least one signal parameter set.

BACKGROUND ART

Generally, in times of an increasing amount of data in the context of signal provision with special respect to measurement environments for verifying correct functioning of devices under test, there is a growing need of a compression device for compressing a signal, a decompression device for decompressing a compressed signal comprising a remainder signal and at least one signal parameter set, and a method for compressing a signal and/or for decompressing a compressed signal comprising a remainder signal and at least one signal parameter set to significantly reduce said amount of data.

For instance, US 2013/0073263 A1 discloses a system and method, wherein acoustic signals can be classified and identified as to nature and location of the original signal. The system and method determine from an arbitrary set of signals a signature or other characterizing feature and distinguish signals associated with a plurality of conditions by means of dictionaries comprising atoms of signals. Nevertheless, an amount of data with respect to a signal cannot significantly be reduced in an accurate, that is especially without information loss, and efficient manner.

Accordingly, there is a need to provide a compression device for compressing a signal, a decompression device for decompressing a compressed signal comprising a remainder signal and at least one signal parameter set, and a method for compressing a signal and/or for decompressing a compressed signal comprising a remainder signal and at least one signal parameter set, whereby both a high accuracy and a high efficiency are ensured.

SUMMARY OF THE INVENTION

According to a first aspect of the invention, a compression device for compressing a signal is provided. Said compression device comprises an input for inputting the signal, a processor for performing source separation and/or time frame separation to find recognizable signal components with respect to the signal and/or for determining major characteristics of the signal and/or components of the signal as at least one signal parameter set, a signal generator for generating a known signal on the basis of the at least one signal parameter set, a subtractor for subtracting the known signal from the signal to form a remainder signal, and an output for outputting a compressed signal comprising the remainder signal and the at least one signal parameter set. Advantageously, an amount of data with respect to the signal is significantly reduced in an accurate, that is especially without information loss, and efficient manner.

According to a first preferred implementation form of the first aspect of the invention, the compression device further comprises a compressor for compressing or discarding the remainder signal at least partly. Advantageously, for instance, the amount of data can further be reduced, thereby increasing efficiency.

According to a second preferred implementation form of the first aspect of the invention, the compression device further comprises a storage for storing the compressed signal. Advantageously, for example, the compressed signal can be provided at a desired point of time, thereby ensuring a high flexibility, which leads to an increased efficiency.

According to a further preferred implementation form of the first aspect of the invention, the known signal comprises or is at least one of a sine signal, a rectangle signal, a pulse train signal, a triangle signal, a sawtooth signal, a trapezoid signal, a ramp signal, a step signal, a pulse signal, a haversine signal, a sweep signal, a multisine signal, a burst signal, a chirp signal, or any combination thereof. Advantageously, for instance, the known signal may especially be seen as a standard signal being preferably generatable with the aid of a standard signal generator, thereby reducing complexity, and thus also inefficiencies.

According to a further preferred implementation form of the first aspect of the invention, the remainder signal comprises or is a noise signal and/or a noise floor level. Advantageously, for example, in the context of the remainder signal, random noise can be regenerated at a desired level in a simple, and thus also efficient, manner.

According to a further preferred implementation form of the first aspect of the invention, the at least one signal parameter set comprises at least one of a frequency, a time-dependent frequency, an amplitude, a time-dependent amplitude, a modulation type, a bandwidth, characteristics of a sweep, or any combination thereof. Advantageously, for instance, the respective speed of the sweep can efficiently be used.

According to a further preferred implementation form of the first aspect of the invention, for compressing or discarding the remainder signal at least partly, the compressor uses at least one of Zip, 7-Zip, low amplitude left, putting several samples into the same instant of time, determining a certain level of a random noise and/or a noise floor, or any combination thereof. Advantageously, for example, this allows for a high flexibility, thereby increasing efficiency.

According to a further preferred implementation form of the first aspect of the invention, the compression device further comprises a transmitter for transmitting the compressed signal to at least one of a test device, a device under test, a cloud, a computer, or any combination thereof. Advantageously, for instance, the compressed signal can efficiently be provided where it is required.

According to a second aspect of the invention, a decompression device for decompressing a compressed signal comprising a remainder signal and at least one signal parameter set is provided. Said decompression device comprises an input for inputting the compressed signal, a signal generator for generating a known signal on the basis of the at least one signal parameter set, an adder for adding the known signal and the remainder signal to form a signal, and an output for outputting the signal. Advantageously, decompression is achieved in an accurate, that is especially without information loss, and efficient manner.

According to a first preferred implementation form of the second aspect of the invention, the decompression device further comprises a decompressor for decompressing the remainder signal if said remainder signal is compressed. Advantageously, for instance, both accuracy and efficiency can further be increased.

According to a second preferred implementation form of the second aspect of the invention, the decompression device further comprises a storage for storing the signal. Advantageously, for example, the signal can be provided at a desired point of time, thereby ensuring a high flexibility, which leads to an increased efficiency.

According to a further preferred implementation form of the second aspect of the invention, the known signal comprises or is at least one of a sine signal, a rectangle signal, a pulse train signal, a triangle signal, a sawtooth signal, a trapezoid signal, a ramp signal, a step signal, a pulse signal, a haversine signal, a sweep signal, a multisine signal, a burst signal, a chirp signal, or any combination thereof. Advantageously, for instance, the known signal may especially be seen as a standard signal being preferably generatable with the aid of a standard signal generator, thereby reducing complexity, and thus also inefficiencies.

According to a further preferred implementation form of the second aspect of the invention, the remainder signal comprises or is a noise signal and/or a noise floor level. Advantageously, for example, in the context of the remainder signal, random noise can be regenerated at a desired level in a simple, and thus also efficient, manner.

According to a further preferred implementation form of the second aspect of the invention, the at least one signal parameter set comprises at least one of a frequency, a time-dependent frequency, an amplitude, a time-dependent amplitude, a modulation type, a bandwidth, characteristics of a sweep, or any combination thereof. Advantageously, for instance, the respective speed of the sweep can efficiently be used.

According to a further preferred implementation form of the second aspect of the invention, for decompressing the remainder signal, the decompressor uses at least one of Zip, 7-Zip, low amplitude left, putting several samples into the same instant of time, determining a certain level of a random noise and/or a noise floor, or any combination thereof. Advantageously, for example, this allows for a high flexibility, thereby increasing efficiency.

According to a further preferred implementation form of the second aspect of the invention, the decompression device further comprises a transmitter for transmitting the signal to at least one of a test device, a device under test, a cloud, a computer, or any combination thereof. Advantageously, for instance, the signal can efficiently be provided where it is required.

According to third aspect of the invention, a method for compressing a signal and/or for decompressing a compressed signal comprising a remainder signal and at least one signal parameter set is provided. Said method comprises the steps of in a compression case, inputting the signal and/or in a decompression case, inputting the compressed signal, in the compression case, performing source separation and/or time frame separation to find recognizable signal components with respect to the signal and/or for determining major characteristics of the signal and/or components of the signal as at least one signal parameter set, in the compression case and/or in the decompression case, generating a known signal on the basis of the at least one signal parameter set, in the compression case, subtracting the known signal from the signal to form a remainder signal and/or in the decompression case, adding the known signal and the remainder signal to form a signal, and in the compression case, outputting a compressed signal comprising the remainder signal and the at least one signal parameter set and/or in the decompression case, outputting the signal. Advantageously, an amount of data with respect to the signal is significantly reduced in an accurate, that is especially without information loss, and efficient manner.

According to a first preferred implementation form of the third aspect of the invention, the method further comprises the step of in the compression case, compressing or discarding the remainder signal at least partly and/or in the decompression case, decompressing the remainder signal if said remainder signal is compressed. Advantageously, for instance, the amount of data can further be reduced, thereby increasing efficiency.

According to a second preferred implementation form of the third aspect of the invention, the method further comprises the step of in the compression case, storing the compressed signal and/or in the decompression case, storing the signal. Advantageously, for example, the compressed signal or the signal, respectively, can be provided at a desired point of time, thereby ensuring a high flexibility, which leads to an increased efficiency.

According to a further preferred implementation form of the third aspect of the invention, in the compression case and/or in the decompression case, the known signal comprises or is at least one of a sine signal, a rectangle signal, a pulse train signal, a triangle signal, a sawtooth signal, a trapezoid signal, a ramp signal, a step signal, a pulse signal, a haversine signal, a sweep signal, a multisine signal, a burst signal, a chirp signal, or any combination thereof. Advantageously, for instance, the known signal may especially be seen as a standard signal being preferably generatable with the aid of a standard signal generator, thereby reducing complexity, and thus also inefficiencies.

According to a further preferred implementation form of the third aspect of the invention, in the compression case and/or in the decompression case, the remainder signal comprises or is a noise signal and/or a noise floor level. Advantageously, for example, in the context of the remainder signal, random noise can be regenerated at a desired level in a simple, and thus also efficient, manner.

According to a further preferred implementation form of the third aspect of the invention, in the compression case and/or in the decompression case, the at least one signal parameter set comprises at least one of a frequency, a time-dependent frequency, an amplitude, a time-dependent amplitude, a modulation type, a bandwidth, characteristics of a sweep, or any combination thereof. Advantageously, for instance, the respective speed of the sweep can efficiently be used.

According to a further preferred implementation form of the third aspect of the invention, the method further comprises the step of in the compression case, especially for compressing or discarding the remainder signal at least partly, using at least one of Zip, 7-Zip, low amplitude left, putting several samples into the same instant of time, determining a certain level of a random noise and/or a noise floor, or any combination thereof and/or in the decompression case, especially for decompressing the remainder signal, using at least one of Zip, 7-Zip, low amplitude left, putting several samples into the same instant of time, determining a certain level of a random noise and/or a noise floor, or any combination thereof. Advantageously, for example, this allows for a high flexibility, thereby increasing efficiency.

According to a further preferred implementation form of the third aspect of the invention, the method further comprises the step of in the compression case, transmitting the compressed signal to at least one of a test device, a device under test, a cloud, a computer, or any combination thereof and/or in the decompression case, transmitting the signal to at least one of a test device, a device under test, a cloud, a computer, or any combination thereof.

Advantageously, for instance, the compressed signal or the signal, respectively, can efficiently be provided where it is required.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
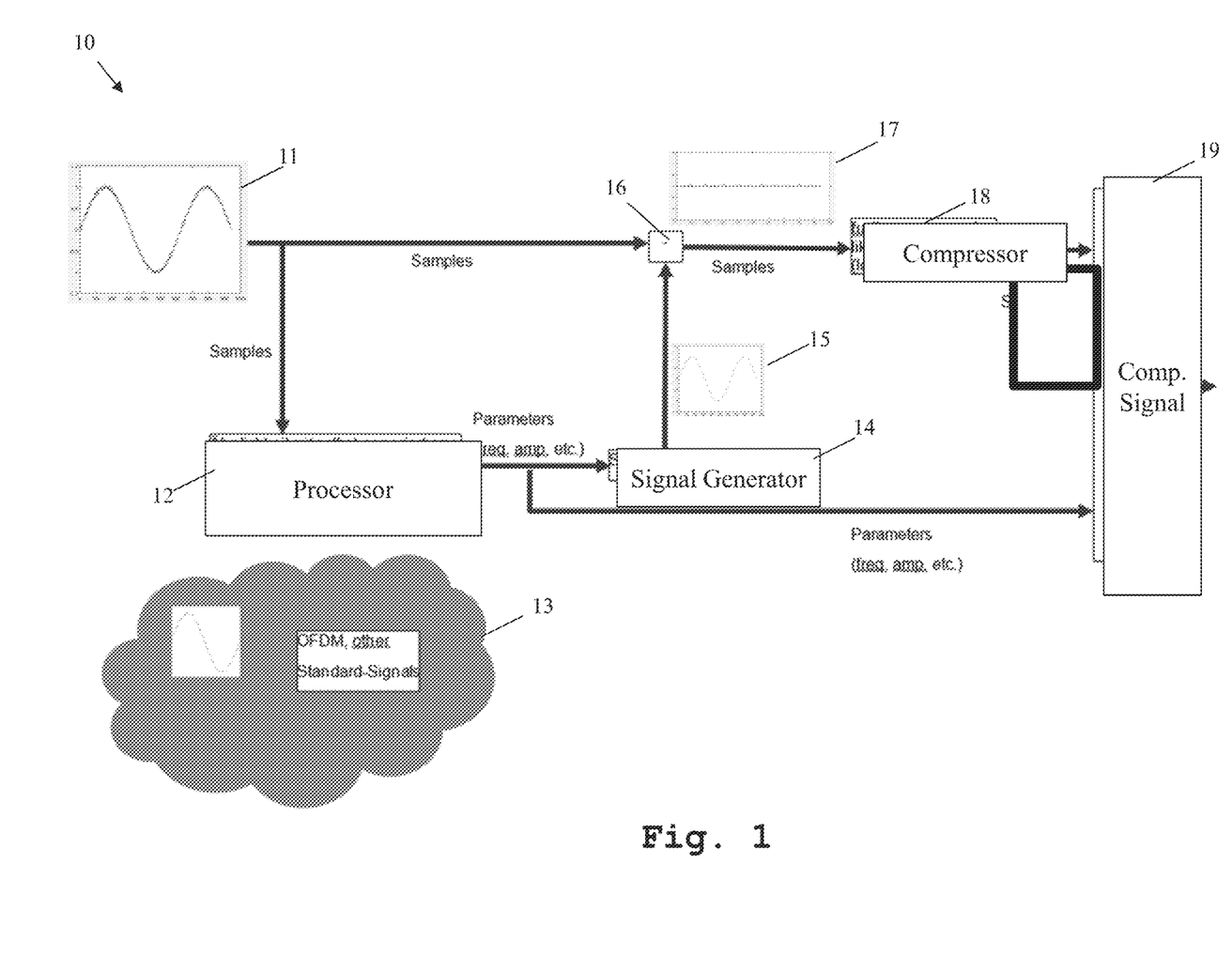
FIG. 1 shows an exemplary embodiment of the inventive compression device.

Firstly, FIG. 1 illustrates an exemplary embodiment of the inventive compression device 10 for compressing a signal 11.

In accordance with FIG. 1, said compression device 10 comprises an input for inputting the signal 11, which provides said signal 11 for a processor 12. In this context, it is noted that said input can especially be a receiver for sampling the signal 11 or any source already providing the signal 11 as sampled. In particular, and as exemplarily shown, the correspondingly sampled signal is provided for the processor 12.

With respect to the above-mentioned source, it is noted that said receiver or source, respectively, can comprise or be a vector signal analyzer, an oscilloscope, an analog-to-digital converter, a file, or any combination thereof.

With respect to the processor 12, it is noted that said processor 12 is configured to perform source separation and/or time frame separation to find recognizable signal components with respect to the signal 11 and/or to determine major characteristics of the signal 11 and/or components of the signal 11 as at least one signal parameter set.

In particular, the processor 12 is exemplarily configured to check similarities with signals being generatable, especially self-generatable, by the signal generator 14 of the compression device 10 to form the at least one signal parameter set, on the basis of which said signal generator 14 can generate a correspondingly known signal.

With respect to the at least one signal parameter set, it is noted that said at least one signal parameter set may comprise at least one of a frequency, a time-dependent frequency, an amplitude, a time-dependent amplitude, a modulation type, a bandwidth, characteristics of a sweep, or any combination thereof.

It is further noted that it might be particularly advantageous if especially in the context of determining the at least one signal parameter set, the processor 12 uses at least one of an artificial intelligence, a modulation recognition, a bandwidth determination, a signal intelligence unit, a FFT (Fast Fourier Transform), an IFFT (Inverse Fast Fourier Transform), or any combination thereof.

Furthermore, the above-mentioned signal generator 14 exemplarily generates the known signal 15 on the basis of the at least one signal parameter set. Basically, the signal generator 14 may generate standard signals such as orthogonal frequency-division multiplexing (OFDM) signals. Accordingly, it might be particularly advantageous if especially in the context of checking similarities, the processor 12 is provided with the signals, especially standard signals, being generatable by the signal generator 14 exemplarily via a cloud 13.

With respect to generating the known signal 15, it is noted that said generation can be done in the analog or digital domain. In addition to this or as an alternative, said generation can be done in hardware or purely in software.

Furthermore, with respect to the known signal 15, it is noted that said known signal 15 may comprise or be at least one of a sine signal, a rectangle signal, a pulse train signal, a triangle signal, a sawtooth signal, a trapezoid signal, a ramp signal, a step signal, a pulse signal, a haversine signal, a sweep signal, a multisine signal, a burst signal, a chirp signal, or any combination thereof.

As it can further be seen from FIG. 1, the compression device additionally comprises a subtractor 16 for subtracting the known signal 15 from the signal 11 exemplarily being a sine signal superimposed by a noise signal to form a remainder signal 17. Accordingly, in this exemplary case, the remainder signal 17 is said noise signal.

The remainder signal 17 or the samples thereof, respectively, are exemplarily provided for a compressor 18 of the compression device 10, said compressor 18 compressing or discarding the remainder signal 17 at least partly.

Especially for compressing or discarding the remainder signal at least partly, the compressor 18 may use at least one of Zip, 7-Zip, low amplitude left, putting several samples into the same instant of time, determining a certain level of a random noise and/or a noise floor, or any combination thereof.

It is noted that it might be particularly advantageous if the remainder signal 17, especially for the case that its content is not important preferably according to certain criteria and/or its content is not required for the respective desired measurement, is stored as just a noise floor level and/or generated as standard noise at that level.

Moreover, the compression device 10 comprises an output 19 for outputting a compressed signal comprising the remainder signal 17 or the compressed samples thereof, respectively, and the at least one signal parameter set.

It is noted that the compression device 10 or the output 19 may preferably comprise a storage for storing the compressed signal.

It is further noted that the compression device 10 or the output 19 may preferably comprise a transmitter for transmitting the compressed signal to at least one of a test device, a device under test, a cloud, a computer, or any combination thereof.

Figure 2:
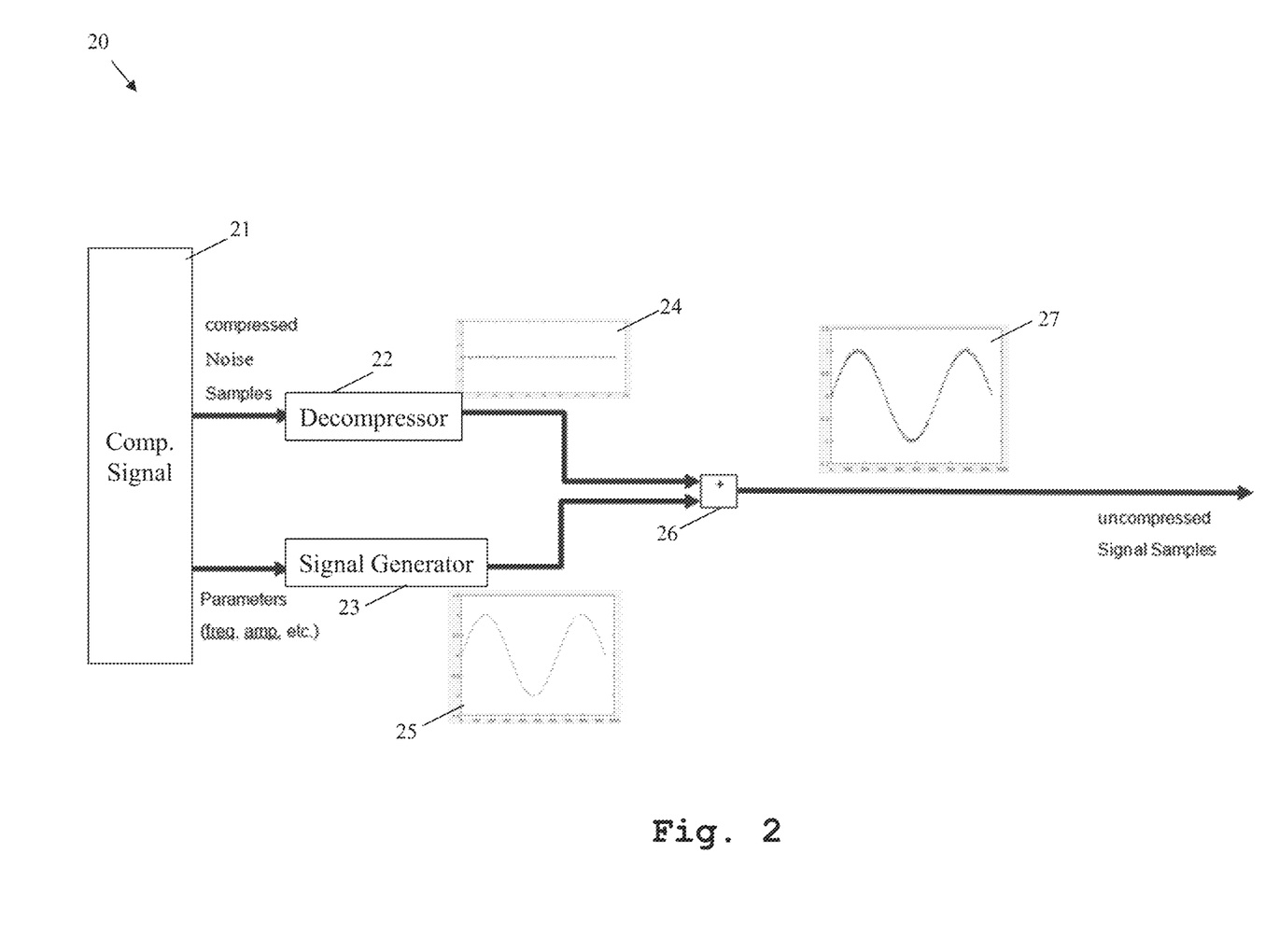
FIG. 2 shows an exemplary embodiment of the inventive decompression device.

Now, with respect to FIG. 2, an exemplary embodiment 20 of the inventive decompression device for decompressing a compressed signal is depicted.

As it can be seen from FIG. 2, said decompression device 20 comprises an input 21 for inputting the compressed signal which comprises a remainder signal, exemplarily compressed noise samples, and at least one signal parameter set.

With respect to said at least one signal parameter set, it is noted that the at least one signal parameter set may comprise at least one of a frequency, a time-dependent frequency, an amplitude, a time-dependent amplitude, a modulation type, a bandwidth, characteristics of a sweep, or any combination thereof.

In addition to this, the decompression device 20 comprises a signal generator 23 for generating a known signal 25, exemplarily a sine signal, on the basis of the at least one signal parameter set. Further additionally, the decompression device 20 comprises a decompressor 22 for decompressing the remainder signal, exemplarily the compressed noise samples, which exemplarily leads to a noise signal 24.

It might be particularly advantageous if the decompressor 22 uses at least one of Zip, 7-Zip, low amplitude left, putting several samples into the same instant of time, determining a certain level of a random noise and/or a noise floor, or any combination thereof.

With the aid of an adder 26 of the decompression device 20, the known signal 25 or the samples thereof, respectively, and the noise signal 24 or the samples thereof, respectively, are added to form a signal 27 or samples thereof, respectively. Accordingly, in this exemplary case, said signal 27 is the sine signal 25 superimposed by the noise signal 24 or noise, respectively. With the aid of an output, the signal 27 or the uncompressed signal samples thereof, respectively, are outputted.

With respect to the known signal 25, it is noted that said known signal 25 can comprise or be at least one of a sine signal, a rectangle signal, a pulse train signal, a triangle signal, a sawtooth signal, a trapezoid signal, a ramp signal, a step signal, a pulse signal, a haversine signal, a sweep signal, a multisine signal, a burst signal, a chirp signal, or any combination thereof.

It is noted that the compression device 20 or the above-mentioned output may comprise a storage for storing the signal 27 or the uncompressed signal samples thereof, respectively. Additionally or alternatively, the input 21 can comprise a further storage for storing the compressed signal.

It is further noted that the decompression device 20 or the above-mentioned output may comprise a transmitter for transmitting the signal 27 or the uncompressed signal samples thereof, respectively, to at least one of a test device, a device under test, a cloud, a computer, or any combination thereof.

Figure 3:
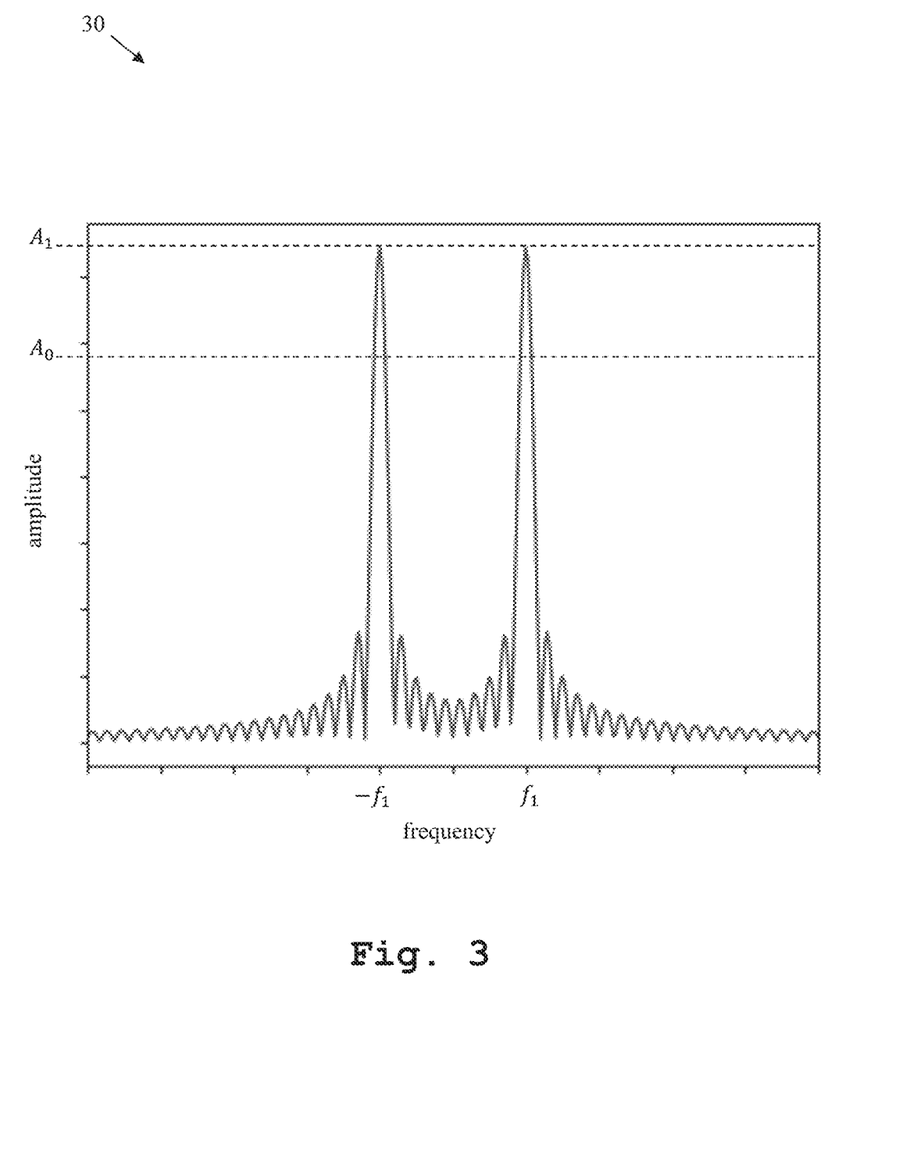
FIG. 3 shows an exemplary frequency-amplitude-diagram in the context of a FFT within the scope of inventive compression.

FIG. 3 illustrates an exemplary frequency-amplitude-diagram 30 in the context of a FFT within the scope of inventive compression such as with the aid of the compression device 10 of FIG. 1. Said FIG. 3 is explained in the light of FIG. 1 in the following.

The processor 12 of the compression device 10 may be configured to perform a FFT with respect to the signal 11. Additionally, especially for forming the at least one signal parameter set, the processor 12 selects frequencies of the FFT result in accordance with an amplitude threshold. Exemplarily, as it can be seen from FIG. 3, the frequency $f_1$ is selected by the processor 12 because its corresponding amplitude $A_1$ exceeds the amplitude threshold $A_0$. Accordingly, in this exemplary case, the at least one signal parameter set comprises said values $A_1$ and $f_1$.

Furthermore, with the aid of said values $A_1$ and $f_1$ of the at least one signal parameter set, the signal generator 14 of the compression device 10 generates the exemplary sine signal 25.

Figure 4:
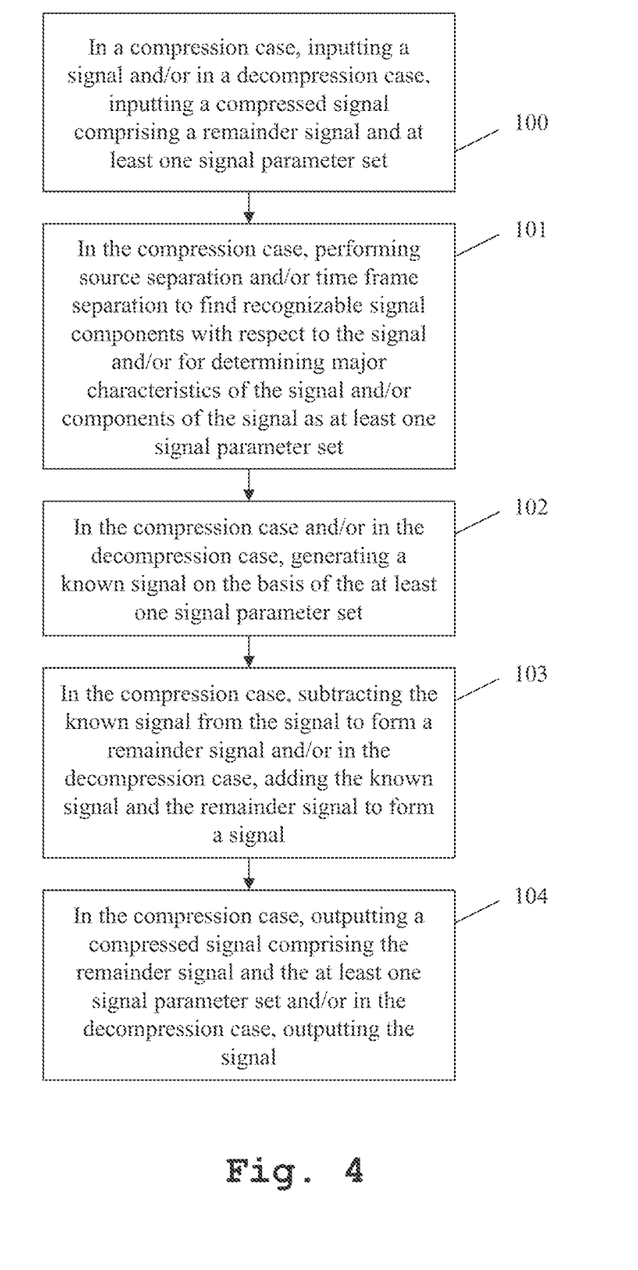
FIG. 4 shows a flow chart of an exemplary embodiment of the third aspect of the invention.

Now, with respect to FIG. 4 a flow chart of an exemplary embodiment of the inventive method for compressing a signal and/or for decompressing a compressed signal comprising a remainder signal and at least one signal parameter set is shown.

A first step 100 comprises in a compression case, inputting the signal and/or in a decompression case, inputting the compressed signal.

Then, a second step 101 comprises in the compression case, performing source separation and/or time frame separation to find recognizable signal components with respect to the signal and/or for determining major characteristics of the signal and/or components of the signal as at least one signal parameter set.

Furthermore, a third step 102 comprises in the compression case and/or in the decompression case, generating a known signal on the basis of the at least one signal parameter set.

Moreover, a fourth step 103 comprises in the compression case, subtracting the known signal from the signal to form a remainder signal and/or in the decompression case, adding the known signal and the remainder signal to form a signal.

In addition to this, a fifth step 104 comprises in the compression case, outputting a compressed signal comprising the remainder signal and the at least one signal parameter set and/or in the decompression case, outputting the signal.

It is noted that all the explanations above analogously apply for said method.

Figure 5:
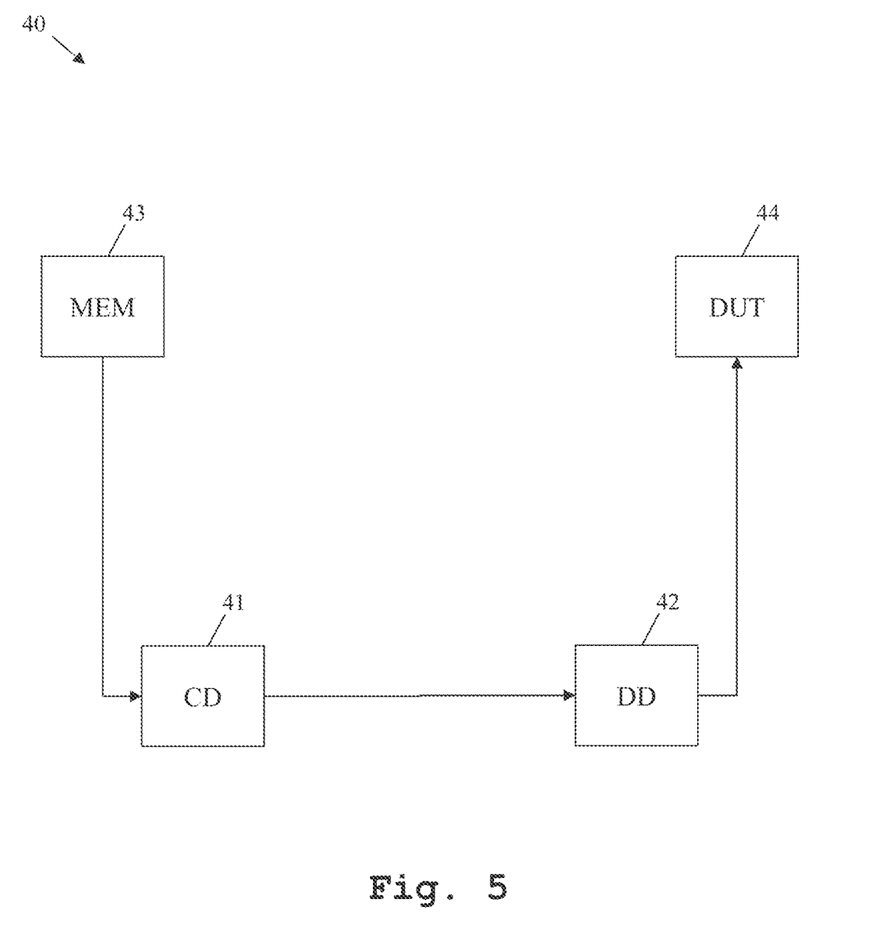
FIG. 5 shows an exemplary embodiment of a system in the sense of the invention.

Finally, FIG. 5 depicts an exemplary embodiment 40 of a system in the sense of the invention. Basically, it is noted that a system comprising an inventive compression device and an inventive decompression device can be seen as an additional aspect, especially a fourth aspect, of the invention.

In the exemplary case of FIG. 5, the system 40 comprises a compression device 41, such as the compression device 10 of FIG. 1, a decompression device 42, such as the decompression device 20 of FIG. 2, a memory 43, and a device under test 44.

In this context, the device under test 44 is to be supplied with a signal, exemplarily a test signal, being stored in the remote memory 43. Said signal or test signal, respectively, can especially be a time signal.

For a particular efficient transmission of the signal or test signal, respectively, exemplarily in the sense of saving bandwidth, from the remote memory 43 to the device under test 44, said signal or test signal, respectively, is firstly compressed and then decompressed.

Accordingly, the compression device 41 receives the signal or the test signal, respectively, from the memory 43 and compresses it for transmitting the correspondingly compressed signal or samples thereof, respectively, via a communication channel to the decompression device 42. Said decompression device 42 receives said compressed signal or the samples thereof, respectively, and decompresses it for supplying the device under test 44 with the correspondingly decompressed signal or samples thereof.

With respect to the system 40, it is noted that said system 40 can exemplarily be seen as a measurement system, especially a distributed measurement system. It is further noted that with respect to the memory 43, said memory 43 can be comprised by a cloud, a computer, especially a personal computer, or a mobile device, especially a tablet or a smartphone.

Furthermore, it should be hinted that parts of the system 40 can be combined in another advantageous manner. In this context, for instance, a test signal generator may comprise the memory 43 and the decompression device 42 connected to said memory 43, wherein the memory 43 comprises a compressed test signal or samples thereof, respectively. In other words, said test signal generator may comprise the decompression device 20 of FIG. 2, wherein the input 21 of the decompression device 20 comprises the further storage for storing the compressed signal or compressed test signal, respectively, as mentioned above.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A compression device for compressing a signal, the compression device comprising:
    an input for inputting the signal,
    a processor for performing source separation and/or time frame separation to find recognizable signal components with respect to the signal and/or for determining major characteristics of the signal and/or components of the signal as at least one signal parameter set,
    a signal generator for generating a known signal on the basis of the at least one signal parameter set,
    a subtractor for subtracting the known signal from the signal to form a remainder signal, and
    an output for outputting a compressed signal comprising the remainder signal and the at least one signal parameter set.

2. The compression device according to claim 1, wherein the compression device further comprises a compressor for compressing or discarding the remainder signal at least partly.

3. The compression device according to claim 2, wherein for compressing or discarding the remainder signal at least partly, the compressor uses at least one of Zip, 7-Zip, low amplitude left, putting several samples into the same instant of time, determining a certain level of a random noise and/or a noise floor, or any combination thereof.

4. The compression device according to claim 1, wherein the compression device further comprises a storage for storing the compressed signal.

5. The compression device according to claim 1, wherein the known signal comprises or is at least one of a sine signal, a rectangle signal, a pulse train signal, a triangle signal, a sawtooth signal, a trapezoid signal, a ramp signal, a step signal, a pulse signal, a haversine signal, a sweep signal, a multisine signal, a burst signal, a chirp signal, or any combination thereof.

6. The compression device according to claim 1, wherein the remainder signal comprises or is a noise signal and/or a noise floor level.

7. The compression device according to claim 1, wherein the at least one signal parameter set comprises at least one of a frequency, a time-dependent frequency, an amplitude, a time-dependent amplitude, a modulation type, a bandwidth, characteristics of a sweep, or any combination thereof.

8. The compression device according to claim 1, wherein the compression device further comprises a transmitter for transmitting the compressed signal to at least one of a test device, a device under test, a cloud, a computer, or any combination thereof.

9. A decompression device for decompressing a compressed signal comprising a remainder signal and at least one signal parameter set, the decompression device comprising:
    an input for inputting the compressed signal,
    a signal generator for generating a known signal on the basis of the at least one signal parameter set,
    an adder for adding the known signal and the remainder signal to form a signal, and
    an output for outputting the signal.

10. The decompression device according to claim 9, wherein the decompression device further comprises a decompressor for decompressing the remainder signal if said remainder signal is compressed.

11. The decompression device according to claim 10, wherein for decompressing the remainder signal, the decompressor uses at least one of Zip, 7-Zip, low amplitude left, putting several samples into the same instant of time, determining a certain level of a random noise and/or a noise floor, or any combination thereof.

12. The decompression device according to claim 9, wherein the decompression device further comprises a storage for storing the signal.

13. The decompression device according to claim 9, wherein the known signal comprises or is at least one of a sine signal, a rectangle signal, a pulse train signal, a triangle signal, a sawtooth signal, a trapezoid signal, a ramp signal, a step signal, a pulse signal, a haversine signal, a sweep signal, a multisine signal, a burst signal, a chirp signal, or any combination thereof.

14. The decompression device according to claim 9, wherein the remainder signal comprises or is a noise signal and/or a noise floor level.

15. The decompression device according to claim 9, wherein the at least one signal parameter set comprises at least one of a frequency, a time-dependent frequency, an amplitude, a time-dependent amplitude, a modulation type, a bandwidth, characteristics of a sweep, or any combination thereof.

16. The decompression device according to claim 9, wherein the decompression device further comprises a transmitter for transmitting the signal to at least one of a test device, a device under test, a cloud, a computer, or any combination thereof.

17. A method for compressing a signal and/or for decompressing a compressed signal comprising a remainder signal and at least one signal parameter set, the method comprising the steps of:
    in a compression case, inputting the signal and/or in a decompression case, inputting the compressed signal,
    in the compression case, performing source separation and/or time frame separation to find recognizable signal components with respect to the signal and/or for determining major characteristics of the signal and/or components of the signal as at least one signal parameter set,
    in the compression case and/or in the decompression case, generating a known signal on the basis of the at least one signal parameter set, in the compression case, subtracting the known signal from the signal to form a remainder signal and/or in the decompression case, adding the known signal and the remainder signal to form a signal, and in the compression case, outputting a compressed signal comprising the remainder signal and the at least one signal parameter set and/or in the decompression case, outputting the signal.

18. The method according to claim 17, wherein the method further comprises the step of:

in the compression case, compressing or discarding the remainder signal at least partly and/or in the decompression case, decompressing the remainder signal if said remainder signal is compressed.

19. The method according to claim 17, wherein the method further comprises the step of:

in the compression case, storing the compressed signal and/or in the decompression case, storing the signal.

20. The method according to claim 17, wherein in the compression case and/or in the decompression case, the known signal comprises or is at least one of a sine signal, a rectangle signal, a pulse train signal, a triangle signal, a sawtooth signal, a trapezoid signal, a ramp signal, a step signal, a pulse signal, a haversine signal, a sweep signal, a multisine signal, a burst signal, a chirp signal, or any combination thereof.

* * * * *